United States Patent [19]

Ingle et al.

[11] Patent Number: 4,800,317

[45] Date of Patent: Jan. 24, 1989

[54] ULTRASONIC TRANSDUCER METHOD AND APPARATUS

[75] Inventors: Frank W. Ingle; John P. Claude, both of Palo Alto, Calif.

[73] Assignee: Medasonics, Inc., Mountain View, Calif.

[21] Appl. No.: 52,908

[22] Filed: May 22, 1987

Related U.S. Application Data

[62] Division of Ser. No. 895,274, Aug. 11, 1986, Pat. No. 4,691,418.

[51] Int. Cl.[4] .................... H01L 41/08

[52] U.S. Cl. .................... 310/334; 310/336; 310/335; 73/642

[58] Field of Search .................... 310/334–337, 310/, 348; 73/624, 625, 628, 642, 644

[56] References Cited

U.S. PATENT DOCUMENTS

| | | | |
|---|---|---|---|
| 2,875,607 | 3/1959 | Boxcer et al. | 310/336 X |
| 3,546,924 | 12/1970 | Nussbaum | 73/644 |
| 3,859,984 | 1/1975 | Langley | 73/642 X |
| 4,217,684 | 8/1980 | Brisken et al. | 310/334 X |
| 4,240,002 | 12/1980 | Tosi et al. | 310/334 X |
| 4,686,408 | 8/1987 | Ishiyama | 310/334 |

*Primary Examiner*—Mark O. Budd

*Attorney, Agent, or Firm*—Fliesler, Dubb, Meyer and Lovejoy

[57] ABSTRACT

An ultrasonic transducer assembly comprising an injection-molded body member, a pair of piezoelectric ceramic members and a multi-pin connector is described. The piezoelectric ceramic members are electrically connected to the multi-pin connector by means of thin metallic ribbons. When assembled, the transducer assembly is detachably inserted in recesses provided therefor in the end of a hand-held probe.

11 Claims, 2 Drawing Sheets

ULTRASONIC TRANSDUCER METHOD AND APPARATUS

This is a division of Ser. No. 895,273, filed Aug. 11, 1986, now U.S. Pat. No. 4,691,418.

BACKGROUND OF THE INVENTION

1. Field of the Invention

The present invention relates to ultrasonic transducers in general and in particular to a novel ultrasonic transducer assembly and a method of manufacturing and assembling the same in a manner calculated to reduce labor and increase uniformity and reliability.

2. Description of Prior Art

An ultrasonic transducer assembly typically consists of one or more thin slabs of piezoelectric ceramic material mounted behind a faceplate. A backing material may or may not be attached to the rear of the transducer and one or more layers of matching material may or may not be attached to the front of the transducer. The front and rear faces of the ceramic are covered with a conductive electrode. Heretofore, electrical connections have been made to these electrodes by means of solder or a conductive epoxy.

In operation, the faceplate provides an acoustic impedance transformation from the ceramic to the working medium, as well as protecting the ceramic and providing electrical isolation.

Typical simple designs use a faceplate thickness of approximately one fourth of an acoustic wavelength at the normal frequency of operation. The faceplate is made of a material whose acoustic impedance lies between that of the ceramic and the working medium. This improves the impedance matching of the ceramic to the medium and increases the bandwidth of the transducer. This has the effect of increasing the efficiency of the transducer and sharpening the time response, which is important if the unit is used in the pulse mode. For continuous wave doppler ultrasonic device, the signal bandwidth is nearly zero, so a backing material is not necessary.

At the frequencies used in medical doppler ultrasonic blood flow meters, e.g. 2 MHz, an acoustic matching faceplate one quarter of a wavelength thick is quite thin. A typical faceplate might be, for example, 5 to 20 thousandths of an inch thick. Not only has a faceplate this thin been difficult to fabricate using conventional techniques, but also the use of conventional techniques has provided little protection for the brittle ceramic transducer.

In the past, faceplates were made from plastic film, such as Mylar ®, but adhesion to the plastic and sealing of the edges of the plastic to the ceramic transducer has posed difficulties in practice. In alternative prior known techniques, faceplates have been made by machining a solid piece of plastic down to the required thickness or casting the layer onto the surface of the transducer and grinding it down to the desired thickness. While these methods provide a faceplate with hermetic sealing properties, they are difficult to accomplish and are expensive.

In still another prior known manufacturing technique, some manufacturers have simply cast the ceramic into a block of resin or epoxy of unknown thickness. This has resulted in acoustic characteristics and ultrasonic beam profiles which are uncontrolled and of poor quality.

Attachment of the electrical contact to the front face of the ceramic members has also given rise to difficulties, given the thin faceplate attached to the front side of the ceramic. One method is to solder a wire to each front face of the ceramic members, but the resulting "bump" on the front face causes the ceramic member to be inclined at an unpredictable angle relative to the faceplate. Silver epoxy has been used also to connect the front face of the ceramic members to a nearby conductor, but the method is very labor intensive. Some manufacturers have the ceramic fabricated with a silver electrode which wraps over the edge and onto part of the rear face. This ceramic is much more expensive, and performance is poor.

SUMMARY OF THE INVENTION

In view of the foregoing, the principal objects of the present invention are a novel ultrasonic transducer assembly and a method of injection-molding and assembling the same which is calculated to reduce labor and increase uniformity and reliability.

In accordance with the above objects there is provided a detachable piezoelectric ceramic transducer assembly. In the assembly there are provided an injection-molded faceplate, a pair of D-shaped piezoelectric ceramic members and an L-shaped pin connector. The faceplate comprises material with a thickness equal to an odd multiple of quarter wavelengths at the acoustic frequency of operation, a low acoustic loss optically transparent material, strengthening ribs, and a rim for mounting the assembly in a detachable manner in a hand-held probe. In the interior of the faceplate there is provided a pair of recesses for receiving the ceramic members. Extending from the faceplate there is provided a multiple pin receiving post, which is provided with four holes for receiving a corresponding number of pins in the L-shaped pin connector. A corresponding number of conductive ribbons is provided for connecting the ceramic members to the pins in the L-shaped pin connector.

To produce the above-described transducer assembly using injection-molding techniques, a number of plastics were found which are injection-moldable, transparent to ultraviolet radiation, and exhibit low acoustic losses. It was also found that by using materials which exhibit low acoustic losses, it is possible to injection-mold a faceplate having excellent acoustic properties when the thickness of the faceplate is an odd multiple of quarter wavelengths at the acoustic frequency of operation.

In the process of molding the faceplate, a reinforcing rim is provided around the periphery of the faceplate to protect the ceramic members and to facilitate mounting the faceplate assembly to the probe. Further, raised surfaces are provided on the inside of the faceplate to locate the ceramic members, allow spaces for excess adhesive, and provide acoustic isolation of one ceramic member from the other.

The chosen injection-moldable plastic is transparent to ultraviolet (UV) radiation, allowing the use of ultraviolet light for curing the epoxy used for adhering the ceramic members to the faceplate. In practice, a controlled amount of UV curable epoxy is dispensed from a precision dispensing microliter pipet into each well of the injection-molded faceplate. The two crystals are then pressed into place and thereafter the epoxy is cured by exposure through the front face to a few seconds of light from a UV light source.

To make electrical contact with the ceramic faces, the thin metallic ribbons are spot-welded to the front and rear electrodes of the ceramic. The ribbon is less than one mil thick so the thickness of the bond does not interfere with the flush mounting of the ceramic onto the faceplate. If this were not the case, the "bump" would cause the ceramic to be canted, or a pit would be required in the faceplate to accept the bump. Although the ribbon is very thin, its width of approximately 25 mils gives it sufficient strength to make it much easier to handle than a fine wire. Therefore, the ribbons offer both good mechanical properties and high electrical conductivity.

In practice, each ceramic is first scored along its diameter, on one face. Two ribbons are spot welded to each face, on each side of the score. The ceramic is then broken into two pieces along the score line, and the two pieces are bonded to the same molded faceplate.

The copper ribbons are strong, but not strong enough to connect to electronics distant from the ceramic assembly. Further, the assembly should be individually testable and easily interchangeable. For these reasons, the injection-moldable faceplate also includes the post for receiving the electrical connector. To make connection with the ribbon wires, tapered holes are provided in the injection-molded post. The ribbons are inserted into the holes after the ceramic members are bonded to the faceplate. The male connector pins are then pressed into the holes, offering a long, tight bonding surface for the metallic ribbons. The plastic body of the connector is then bonded to the body of the faceplate for mechanical stability.

The resulting transducer assembly is easily interchangeable, inexpensive to manufacture, rugged, and well protected.

BRIEF DESCRIPTION OF THE DRAWING

The above and other objects, features and advantages of the present invention will become apparent from the following detailed description of the accompanying drawing, in which.

DETAILED DESCRIPTION OF THE DRAWING

Figure 1:
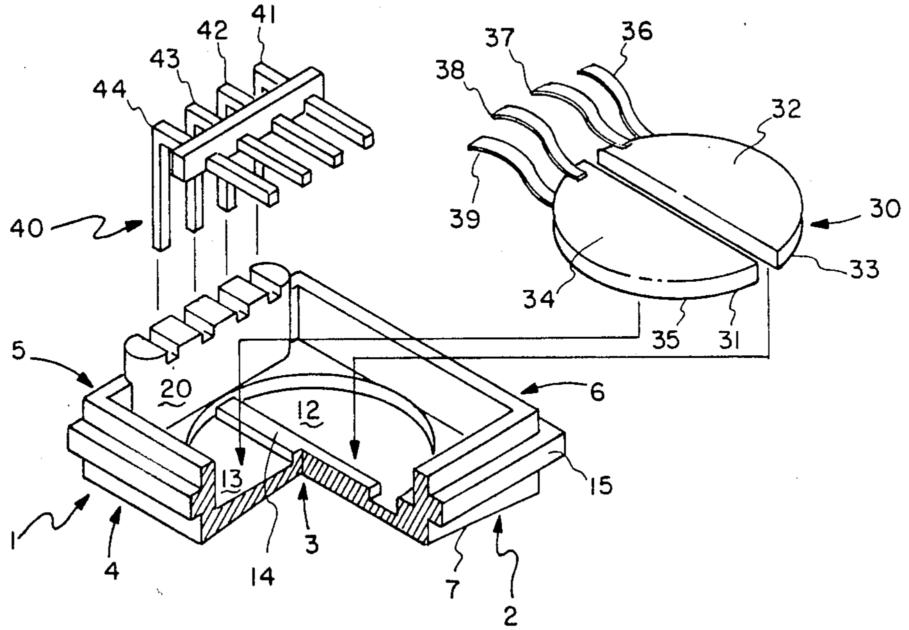
FIG. 1 is an exploded view of an ultrasonic transducer assembly according to the present invention.
Figure 5:
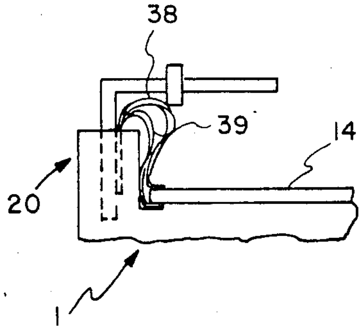
FIG. 5 is a partial side elevation view of the assembled apparatus of FIG. 1.

Referring to FIG. 1, there is provided in accordance with the present invention an ultrasonic transducer asesmbly designated generally as 1. In the assembly 1 there is provided a body member designated generally as 2. In the body member 2 there are provided an end wall 3 and a plurality of side walls 4, 5, 6 and 7.

Figure 4:
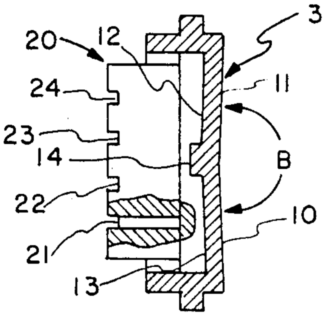
FIG. 4 is a cross-sectional view taken in the direction of lines 4—4 of FIG. 2.

In the end wall 3, as shown more clearly in FIG. 4, there is provided a pair of planar surfaces 10 and 11. The planar surfaces 10 and 11 extend outwardly from a centerline of the end wall 3 to opposite side edges of the end wall 3 at a predetermined angle B relative to each other. The angle B is typically 176 degrees. In the interior of the end wall 3 there is provided a pair of recesses 12 and 13. The recesses 12 and 13 are separated from each other by a central rib 14 which extends along said centerline of said end wall. The recesses 12 and 13 are parallel to the planar surfaces 11 and 10, respectively.

Located between the top and bottom surfaces of each of the side walls 4–7, there is provided an outwardly extending exterior rib member 15 which extends about the periphery of the side walls 4–7. Located at one end of the central rib member 14 and formed as an integral part of the end wall 5, there is provided a multiple pin receiving post 20. In the post 20 there is provided a plurality of equally spaced tapered pin receiving holes 21, 22, 23 and 24.

Mounted in the recesses 12 and 13 there is provided, respectively, a pair of D-shaped piezoelectric ceramic planar members 30 and 31. The rear surface of the member 30 is covered with a metal electrode 32. The front surface of the member 30 is covered with a corresponding metal electrode 33. Similarly, the rear surface of the member 31 is covered with a metal electrode 34 and the front surface of the member 31 is covered with a metal electrode 35. Attached to the electrodes 32–35 there is provided a plurality of thin metallic ribbons 36, 37, 38 and 39. Each of the ribbons 36–39 is attached to its corresponding electrode by means of spot welding. Each of the ribbons is less than 1 mil thick, approximately 25 mils wide and has a length sufficient for it to be inserted well into a corresponding one of the holes 21–24 in the post 20.

To attach the ribbons 36–39 to an external apparatus, there is provided a multiple pin connector assembly designated generally as 40. In the connector 40 there is provided a plurality of L-shaped pin members 41, 42, 43 and 44. The pin members 41–44 are adapted to be inserted in the tapered holes 24–21, respectively, along with a corresponding one of the ribbons 36–39, respectively.

In the preferred embodiment of the present invention, the body member 2 is injection-molded using a material comprising SAN (styrene acrylonitrile), made by Monsanto and known as Lustran®. The material is transparent to ultraviolet radiation and exhibits low acoustic losses at the operating frequency of 2–5 MHz. Preferably the thickness of the end wall 3 between the recesses 12 and 13 and the planar surfaces 11 and 10 comprises a thickness which is an odd quarter multiple of the acoustic wavelength at the operating frequency of the transducer, e.g. 2 MHz. Typically, this thickness is 33 mils. The depth of the holes 21–24 is approximately 200 mils. The height of the rib 14 is approximately 10 mils and the width of the rib 14 is approximately 60 mils.

After the body member 2 is formed, a controlled amount of UV curable epoxy is dispensed from a precision dispensing microliter pipet into each of the recesses 12 and 13. The two ceramic members 30 and 31 with metallic ribbons attached are then pressed into place. The size of the recesses 12 and 13 are such as to allow excess epoxy to be squeezed from beneath the members 30 and 31. After the members 30 and 31 have been pressed into place, the epoxy is cured by exposing the ultraviolet radiation transparent front face of the body member 2 to a few seconds of light from a high intensity ultraviolet light source, such as a high pressure mercury arc lamp. After the members 30 and 31 are cemented in place, the ribbons 36–39 are inserted in the holes 24–21, respectively. Thereafter, the pin members 41–44 of the connector 40 are inserted in the holes 24–21, respectively, forming a friction-tight fit with the ribbons 36–39. Thereafter, the connector 40 is permanently affixed to the post 20 by a suitable adhesive. Alternatively, the metallic ribbons may be soldered to the connecting pins.

Figure 6:
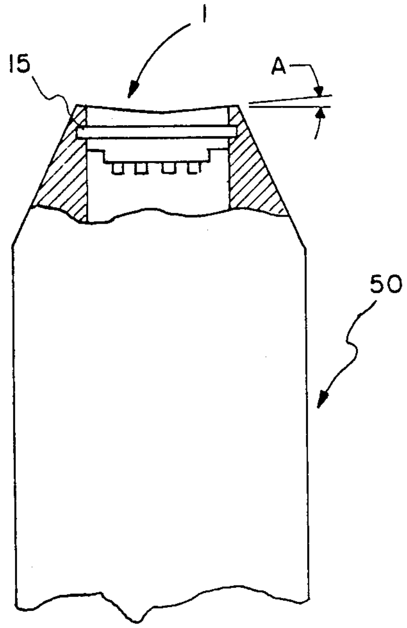
FIG. 6 is a partial side elevation view of the apparatus of FIG. 1, detachably mounted in a hand-held probe.
Figure 3:
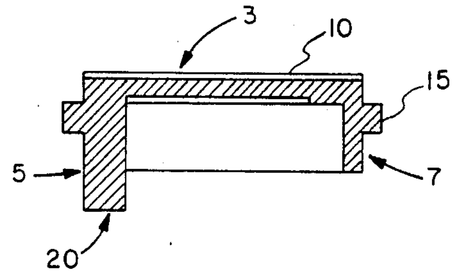
FIG. 3 is a cross-sectional view taken along lines 3—3 of FIG. 2.
Figure 2:
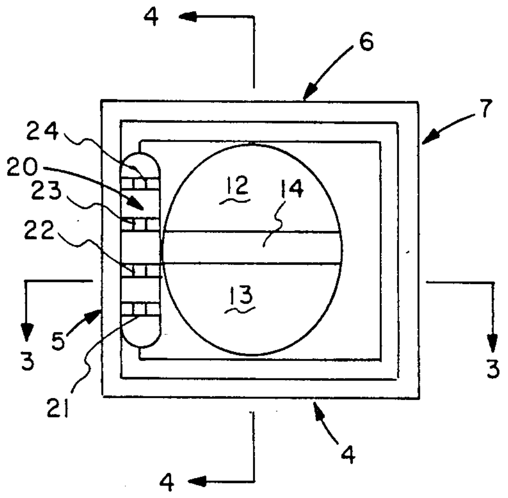
FIG. 2 is a top plan view of FIG. 1 with the electrical connector and ceramic members omitted for clarity.

Referring to FIG. 6, after the transducer assembly 1 is assembled as described above, it is detachably inserted in the end of a hand-held probe 50 by sliding the rib 15 in recesses provided therefor in the end of the probe 50.

In operation, one of the ceramic members 30 and 31 is provided for transmitting ultrasonic signals and the other is provided for receiving ultrasonic signals along transmitting and receiving axes, respectively. The transmitting and receiving axes extend perpendicular to the front surfaces of each of the members, respectively.

While a preferred embodiment of the present invention is described, it is contemplated that various modifications may be made thereto without departing from the spirit and scope thereof. Accordingly, it is intended that the scope of the invention not be limited to the embodiment described but be determined by reference to the claims hereinafter provided.

What is claimed is:

1. An ultrasonic transducer assembly comprising:

a body member having an end wall and a plurality of side walls, said end wall having a pair of exterior planar surfaces, each of said exterior planar surfaces extending from a centerline of said end wall outwardly to a side edge of said end wall at a predetermined angle relative to each other, an interior surface, and a pair of recesses located in said interior surface which are separated from each other by a central rib which extends along said centerline of said end wall, each of said recesses having a planar surface which is parallel to one of said exterior planar surfaces of said end wall, said side walls having an outwardly extending exterior rib which is located between the top and bottom surfaces thereof and which extends about the periphery thereof, one of said end walls which is located at one end of said central rib including a multiple pin receiving post which is integrally formed therewith and which extends perpendicularly from said interior surface of said end wall, said post having a plurality of equally spaced, tapered, pin receiving holes;

a pair of piezoelectric ceramic planar members, each of said members having a pair of conductive electrodes covering and affixed to opposite surfaces thereof, respectively;

a plurality of metal ribbons;

first means for attaching one of said ribbons to each of said electrodes, each of said ribbons having a length sufficient for it to be inserted well into a corresponding one of said plurality of tapered holes in said multiple pin receiving post;

second means for attaching one of said pair of ceramic planar members to said planar surface in each of said recesses; and a multiple pin connector having an electrically conductive pin inserted in each of said tapered holes in such a manner as to form a good electrical connection between said pin and the metal ribbon inserted in said hole.

2. An assembly according to claim 1 wherein said body member comprises an injection-molded body member.

3. An assembly according to claim 1 which is operable at a predetermined acoustic wavelength and wherein said end wall of said body member between said planar surface of each of said recesses and a corresponding one of said exterior planar surfaces comprises a thickness which is an odd quarter multiple of said wavelength.

4. An assembly according to claim 1 wherein said predetermined angle between said exterior planar surfaces comprises approximately 176 degrees.

5. An assembly according to claim 1 wherein said body member comprises a material which is transparent to ultraviolet light and said second attaching means comprises an epoxy which is cured by the exposure thereof to ultraviolet light.

6. An assembly according to claim 1 wherein said first attaching means comprises a spot weld.

7. An assembly according to claim 1 wherein each of said metal ribbons is less than 1 mil thick.

8. An assembly according to claim 1 wherein each of said ceramic planar members comprises a D-shaped ceramic planar member.

9. An ultrasonic transducer assembly which is operable at a predetermined acoustic wavelength comprising:

an injection-molded body member;

a first and a second piezoelectric ceramic member for transmitting and receiving ultrasonic signals, both said first and said second members having electrodes located on opposite surfaces thereof, said first member having a transmitting axis and said second member having a receiving axis;

means for mounting said first and said second members in said body member in planes disposed at a predetermined angle to each other such that said transmitting and receiving axes of said members intersect at a predetermined distance along a line which extends through the center of said body member, said body member having a thickness along said transmitting and receiving axes which is an odd quarter multiple of said predetermined acoustic wavelength; and means for acoustically isolating said first and said second ceramic members;

an electrical connector having a plurality of pin members;

a plurality of metallic ribbons;

means for attaching one end of each of said ribbons to a corresponding one of said electrodes on said surfaces of said ceramic members; and a post member having a plurality of tapered holes, each of said holes corresponding to each of said pin members and each of said ribbons in which each of said pin members and each of said ribbons is inserted in a friction-tight manner.

10. An ultrasonic transducer assembly comprising:

an injection-molded body member which is transparent to ultraviolet radiation having a pair of recesses;

a first and a second piezoelectric ceramic member for transmitting and receiving ultrasonic signals, both said first and said second members having electrodes located on opposite surfaces thereof, said first member having a transmitting axis and said second member having a receiving axis;

an electrical connector having a plurality of pin members;

a plurality of metallic ribbons;

means for attaching one end of each of said ribbons to a corresponding one of said electrodes on said surfaces of said ceramic members;

means for electrically connecting an opposite end of each of said ribbons to a corresponding one of said pin members of said electrical connector; and an adhesive which is cured by exposure to ultraviolet radiation for mounting said first and said second members in said recesses in said body member in planes disposed at a predetermined angle to each other such that said transmitting and receiving axes of said members intersect at a predetermined distance along a line which extends through the center of said body member.

11. An assembly according to claim 10 wherein said body member comprises means extending outwardly from said body member for detachably mounting said assembly in a handheld probe.

* * * * *